United States Patent
Crema et al.

(10) Patent No.: US 6,468,356 B1
(45) Date of Patent: Oct. 22, 2002

(54) METHOD FOR REMOVING MOLDING RESIDUES IN THE FABRICATION OF PLASTIC PACKAGES FOR SEMICONDUCTOR DEVICES

(75) Inventors: Paolo Crema, Milan (IT); Roberto Tiziani, Milan (IT); Markus Guggenmos, Schwandorf (DE)

(73) Assignees: STMicroelectronics S.r.L., Agrate Brianza (IT); Arges Gmbh, Nabburg (DE)

( * ) Notice: Subject to any disclaimer, the term of this patent is extended or adjusted under 35 U.S.C. 154(b) by 0 days.

(21) Appl. No.: 09/535,322

(22) Filed: Mar. 27, 2000

Related U.S. Application Data

(63) Continuation of application No. 09/156,782, filed on Sep. 17, 1998, now abandoned.

(30) Foreign Application Priority Data

Sep. 30, 1997 (EP) .............................................. 97830480

(51) Int. Cl.⁷ .............................. B08B 7/04; B23K 26/00
(52) U.S. Cl. ............................... 134/1; 134/1.2; 134/1.3; 219/121.6; 219/121.76
(58) Field of Search ............................... 134/1, 1.1, 1.3, 134/1.2, 18, 19, 902; 219/121.6, 121.65, 121.68, 121.69, 121.76

(56) References Cited

U.S. PATENT DOCUMENTS

| | | | | |
|---|---|---|---|---|
| 5,099,101 A | * | 3/1992 | Millerick et al. | 219/121.67 |
| 5,361,275 A | * | 11/1994 | Opower | 372/108 |
| 5,961,860 A | * | 10/1999 | Lu et al. | 219/121.65 |

FOREIGN PATENT DOCUMENTS

| | | | |
|---|---|---|---|
| EP | 905762 | * | 3/1999 |
| GB | 2 169 496 A | | 7/1986 |
| GB | 2 177 965 A | | 2/1987 |
| JP | 60-103628 | * | 6/1985 |
| JP | 01-122417 | * | 5/1989 |
| WO | WO 86/07492 | | 12/1986 |

OTHER PUBLICATIONS

Patent Abstracts of Japan, vol. 009, No. 255 (E–349), Oct. 12, 1985, and JP 60 103628A, Jun. 7, 1985.

Y.F. Lu, et al., "Excimer Laser Applications in Integrated Circuit Packaging," Materials Research Society Symposium Proceedings, vol. 397, Nov. 27, 1995, pp. 323–328.

M.C. Gower, "Excimer Lasers: Current and Future Applications in Industry and Medicine," Laser Processing in Manufacturing, 1993, Chapman & Hall, pp. 189–193 and pp. 241–243.

H.K. Park et al., "A Practical Excimer Laser–Based Cleaning Tool for Removal of Surface Contaminants," IEEE Transactions on Components, Packaging and Manufacturing Technology: Part A, vol. 17, No. 4, Dec. 17, 1994, pp. 631–643.

* cited by examiner

*Primary Examiner*—Alexander Markoff
(74) *Attorney, Agent, or Firm*—Lisa K. Jorgenson; Allen, Dyer, Doppelt, Milbrath & Gilchrist, P.A.

(57) ABSTRACT

A method for removing residues of molding material from metal parts of plastic packages of semiconductor devices includes applying first and second pulsed laser radiations to at least one surface region of a metal part covered with residues of molding material. The first pulsed laser radiation has a first wavelength that is absorbed by residues of molding material having a thickness greater than a prescribed thickness. The intensity and the duration of the first pulsed laser radiation causes the residues to be directly attacked. The second pulsed laser radiation has a second wavelength so that residues of molding material having a thickness less than the prescribed value are at least partially transparent and the metal parts are at least partially absorbent. The intensity and the duration of the second pulsed laser radiation causes the formation of plasma at the point of impact with the metal part.

42 Claims, 2 Drawing Sheets

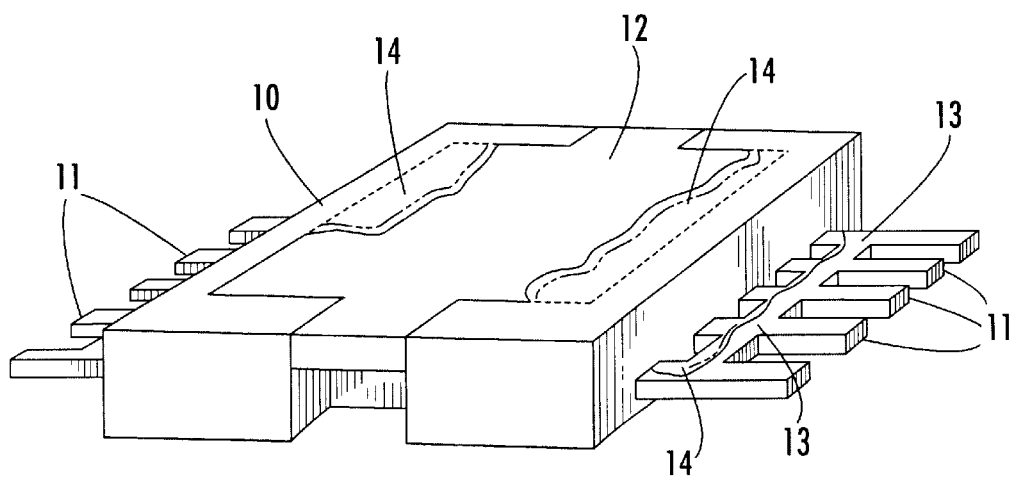
FIG. 1.
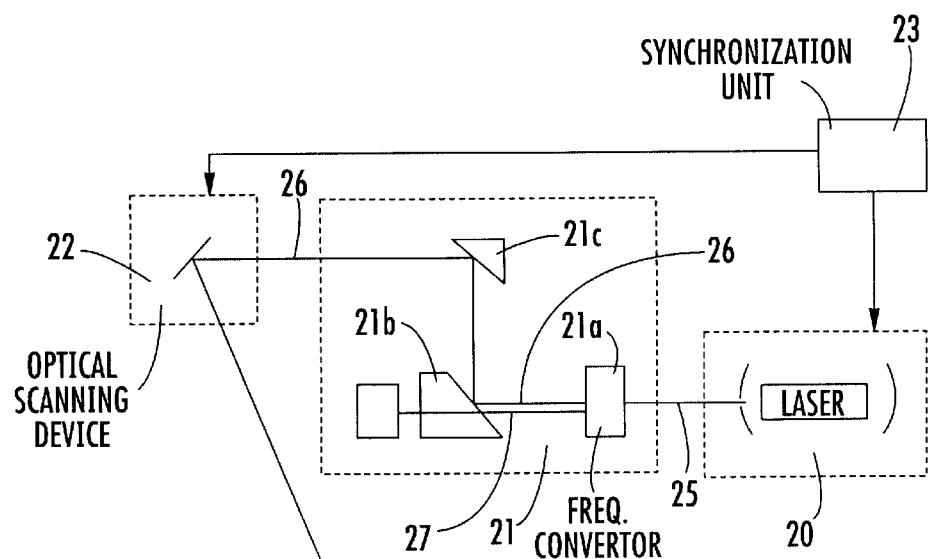
FIG. 2.
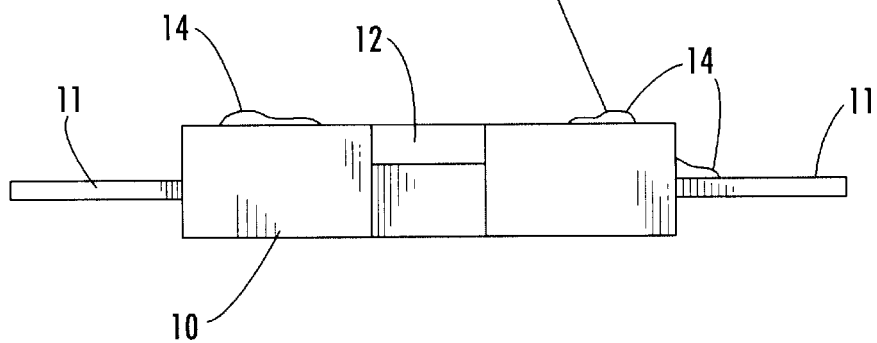

METHOD FOR REMOVING MOLDING RESIDUES IN THE FABRICATION OF PLASTIC PACKAGES FOR SEMICONDUCTOR DEVICES

RELATED APPLICATION

This application is a continuation-in-part of U.S. Patent Application Ser. No. 09/156,782 filed Sep. 17, 1998.

FIELD OF THE INVENTION

The present invention relates to the fabrication of semiconductor devices and, more particularly, to a method for removing residue molding material from metal parts of plastic packages for semiconductor devices.

BACKGROUND OF THE INVENTION

As is known, many semiconductor power devices (e.g., discrete transistors, integrated circuits) are contained in packages including a plastic body with terminal conductors protruding therefrom, and a metal plate. The function of the metal plate is to dissipate heat produced by the device during its operation, or to transfer this heat external the device. The metal plate is usually mounted in contact with a flat surface of an external sink of large dimensions.

For the fabrication of a device of this type, a chip of semiconductor material is fixed to the metal plate which acts as a heat-sink. A metal frame is then mounted on the plate electrically insulated therefrom. The frame, obtained by stamping from sheet metal, includes metal strips which will become the terminals of the device and interconnection bars between the strips. Thin wires are soldered to appropriate areas of the chip and to the ends of the metal strips. The resulting structure is mounted, together with other identical structures, in a special mold with one face of the heat-sink in contact with a flat surface of the mold.

Next, a plastic, such as a thermosetting epoxy resin, is introduced in a liquid state into the mold. After polymerization of the resin, a body of solid plastic is extracted from the mold. This body encloses the whole structure with the exception of a surface of the heat-sink that has remained in contact with the flat surface of the mold. Also not enclosed are portions of the metal strips and of the interconnection bars between them. These latter items are cut off in a subsequent manufacturing phase.

In many cases during the molding operation, the liquid-state resin penetrates between the heat-sink and mold due to small irregularities in the contacting surfaces. This is due, for example, to a slight curvature of the heat-sink or to the wearing of the mold. Therefore, after extraction from the mold, the package may exhibit residues of molding material, i.e., of cured resin, on the heat-sink. Similar infiltrations may occur on the metal strips with the consequent formation of residue on these also, especially near the plastic body.

The residue of plastic on the heat-sink has to be removed since it would otherwise reduce the surface of contact with an external sink, or with a metal plate of a printed circuit onto which the heat-sink is to be soldered. The residue on the terminals also has to be eliminated since it impedes the cutting off of the interconnection bars and the subsequent operation of bending the terminals.

Various methods for removing such residue of molding material are known. For example, electrical or chemical treatments are known which can be advantageously used on the terminals without being used on the heat-sinks. Sand-blasting treatments are also known which enable even thick residue to be removed from the heat-sink and from the terminals. However, because of their very energetic mechanical action, they do not lend themselves to being used in the treatment of plastic packages of small dimensions with very thin and very closely spaced terminals.

SUMMARY OF THE INVENTION

An object of the present invention is to provide a method for removing residue of molding material from metal parts of plastic packages while not mechanically stressing the parts to be treated, and can therefore also be used in the treatment of plastic packages with thin terminals.

The present invention uses laser radiation, i.e., coherent monochromatic radiation, for the controlled application of high-intensity energy. Although the use of lasers in the treatment of materials and in industrial manufacture has been known for some time, it has not before been contemplated with respect to the removal of residue of molding material from plastic packages. Laser radiation has not been used because it was most likely determined to be unsuitable for such a purpose.

BRIEF DESCRIPTION OF THE DRAWINGS

The invention and the advantages which derive therefrom will become clear from the following description of an illustrative and hence non-limiting implementation thereof, given in conjunction with the attached drawings, in which:

FIG. 1 is a perspective view of a plastic package as it appears after molding in accordance with the present invention;

FIG. 2 shows a cross-section of the plastic package of FIG. 1, and illustrates an apparatus for practicing a first embodiment of the invention.

DETAILED DESCRIPTION OF THE PREFERRED EMBODIMENTS

Figure 3:
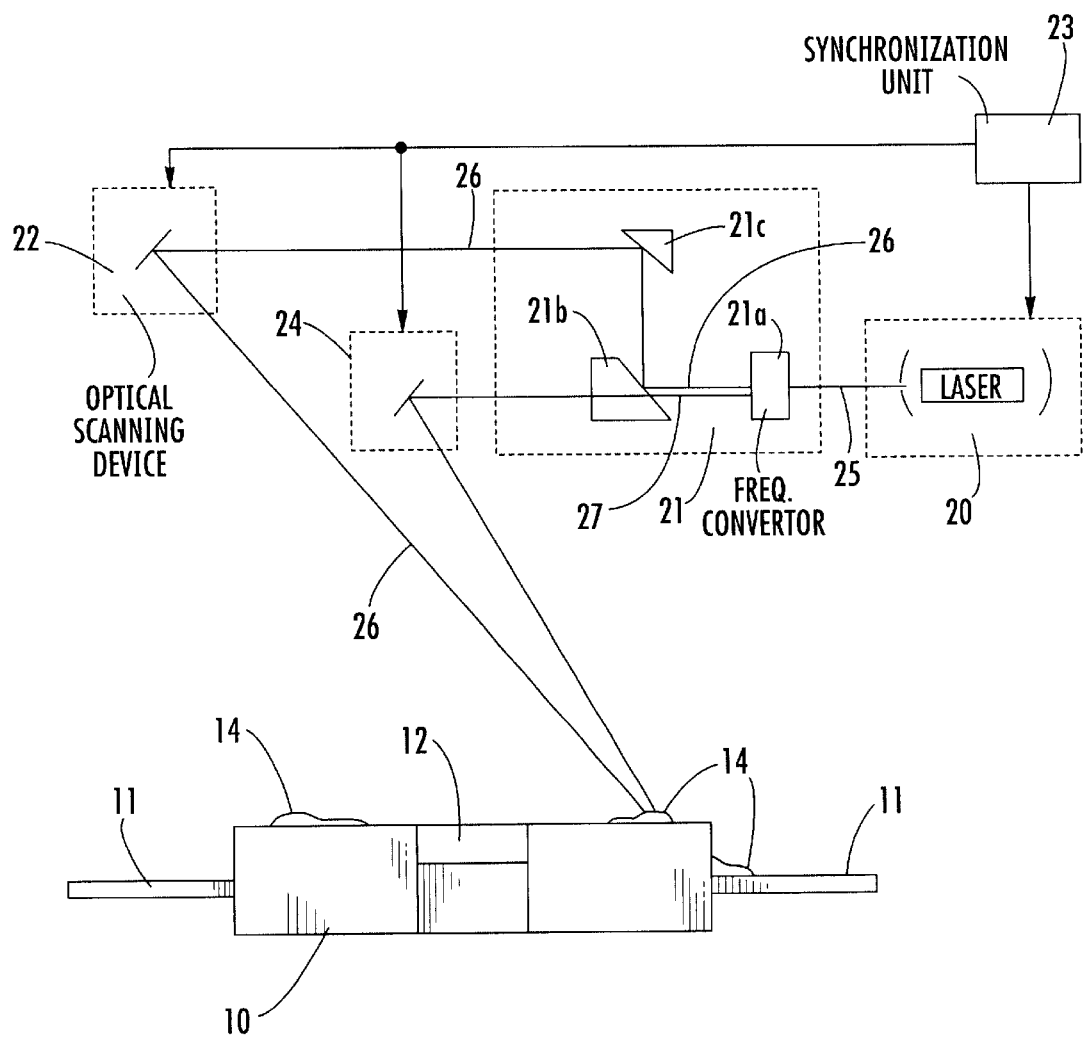
FIG. 3 shows a cross-section of the plastic package of FIG. 1, and illustrates an apparatus for practicing a second embodiment of the invention.

The package shown in the drawings comprises a body made of plastic 10. The plastic, for example, includes an epoxy resin with carbon particles as an additive. The package also comprises a plurality of terminal conductors 11 made of copper or nickel-plated copper, for example, and a metal plate 12 made of copper or nickel-plated copper, for example. The metal plate 12 dissipates heat and supports a chip of semiconductor material. The latter is not visible since it is completely enclosed within the plastic body.

The terminals 11 are joined together by interconnection bars 13 intended to be eliminated by a subsequent cutting operation. Normally, in this manufacturing phase the terminals 11 of the package are linked to the terminals of other packages formed by the same operation and the same mold, and are separated only in the subsequent cutting operation. However, so as not to needlessly complicate the drawing, the terminals of a single package are represented. For the same reason, a package with ten terminals only has been represented. In many practical cases, there are many more terminals. For example, a typical package having a width of 12 mm, a length of 15 mm and a height of 3 mm has thirty-six terminals arranged in two rows of 18, each terminal is 0.3 mm wide and 0.25 mm thick.

Residues of plastic 14 due to the infiltration of resin in the liquid state during molding are shown on the face of the heat-sink 12 which is intended to be mounted in contact with a flat metal element. These residues take the form of thin films of material. Since the carbon particles added to the resin usually have, for the most part, dimensions greater than 10 µm, and when the residual film is very thin, i.e., less than 10 µm thick, the carbon particles are practically absent and the residual film is almost transparent to visible light. On the contrary, when the residual film is thicker than 10 µm, carbon particles, for example, are present and the residual film appears to be black, that is, not transparent to visible light. Residues 14 are shown also on some terminals near the body 10.

In FIG. 2, the package of FIG. 1 is represented in a side view, with the plastic residues 14 shown with a deliberately exaggerated thickness to clarify the drawing. According to a first embodiment of the invention, the apparatus for removing the residues of plastic 14 includes a laser 20, a block 21 for frequency conversion and for splitting and deflecting the laser pulses, an optical scanning device 22 and a synchronization unit 23.

In a practical implementation of the method according to the invention, the laser is of the neodymium YAG type comprising a neodymium-doped yttrium and aluminum crystal in the form of a rod provided with mirrors at its ends. The laser 20 provides a pulsed output radiation 25 having a wavelength of 1,064 nm (infrared light). Pulse durations are between 6 and 8 ns and have an energy of approximately 800 mjoules per pulse. The pulse repetition frequency is around 30 Hz. The output radiation 25 from the laser 20 is applied to a frequency converter 21a, including a $KH_2PO_4$ (deuterated potassium dihydrogen phosphate) crystal. The frequency converter 21a has a conversion efficiency of around 30–35% and provides an output radiation 26 with double the frequency of the input radiation. In other words, the wavelength is reduced one half, i.e., from 1064 nm (infrared light) to 532 nm (green visible light).

A dichromic mirror 21b separates the double frequency radiation 26 from the residual radiation 27 at the same wavelength as the output radiation 25 of the laser by diverting it onto a mirror 21c which, in turn, diverts it to the scanning device 22. The latter includes an optical system capable of controllably directing the 532 nm laser radiation 26 onto predetermined areas of the surface to be treated. In this example, the regions of the heat-sink 12 covered with residues of plastic 14 are to be treated. The synchronization unit 23 synchronizes the emission of the laser radiation pulses with the scanning.

With the operating conditions indicated above, residual epoxy resin films thinner than 10 µm exhibits a transparency of around 20% and the metal used for the heat-sink (copper) exhibits an absorption of around 50%. The laser radiation pulse has such an intensity, i.e., an energy per unit area, so as to cause the formation of plasma with each pulse. The plasma originates from the transformation of the metal atoms and metal oxide atoms located on that surface of the item to be treated (e.g., heat-sink) using high-intensity radiation. The formation of plasma is associated with vaporization of at least part of the residual material 14 present on the impact surface in a circular area of around 2 mm in diameter. The radiation also has a negligible effect of a direct attack on the resin, and particularly on residues of thickness equal to or greater than 10 µm which, instead of being transparent, absorb the radiation.

In other words, the removal of the residual material does not take place by the direct effect of the radiation on the residues. Removal of the residues is mediated by the underlying metal that is highly absorbent at the specific wavelength. This produces a plasma at the interface with the metal that vaporizes the residual material.

Since the degree of removal of the material is dependent on the energy absorbed at the point of impact, the duration of application of the radiation, i.e., the number of pulses applied per unit area, is calculated as a function of the thickness of the residues to be eliminated. Thin residual plastic films (1–10 µm) are eliminated with a single pass of the laser beam in successive steps of 1 mm. The heating up of the heat-sink is negligible. The direct action of the laser radiation pulse on the plastic on those surfaces of the plastic body which were struck by the pulse on account of their being immediately adjacent to the heat-sink is also negligible. Therefore, accurate control of the scan area is not necessary. By the method just described, thicker residues (10–25 µm) are not substantially removed.

FIG. 3 relates to a second embodiment of the method according to the present invention suitable for removing both thin (i.e., less than 10 µm) and thick (i.e., 10–50 µm) residues. Compared to FIG. 2, an apparatus suitable for implementing the method according to this second embodiment includes two optical scanning devices, a first optical scanning device 24 and a second optical scanning device 22.

The first optical scanning device 24 receives and deflects the residual laser radiation 27 at the output of the dichromic mirror 21b. The residual radiation has the same frequency as the radiation 25 at the output of the laser 20. The second optical scanning device 22 receives the double frequency pulse 26. The synchronization unit 23 controls both of the optical scanning devices 22, 24 and selectively activates them and synchronizes the emission of the laser pulses with the scanning. If necessary, a diverting mirror similar to mirror 21c can be provided for diverting the residual laser radiation 27 onto the respective first optical scanning device 24.

The synchronization unit 23 first enables the first optical scanning device 24 to strike the prescribed areas of the surface to be treated, i.e., the areas covered by the plastic residue 14 with the laser radiation 27 at 1064 nm (infrared radiation). The infrared radiation is absorbed quite well by films of epoxy resin of major thickness, particularly greater than 10 µm. These films are in fact black in color since they contain carbon particles. The infrared radiation, containing a component of thermal radiation, directly attacks the material forming the residue, and has a deep effect on the plastic residues 14. Then, the synchronization unit 23 enables the second optical scanning device 22 to strike the prescribed areas of the surface to be treated with the laser radiation 26 at 532 nm (green visible light).

Thin residual films of epoxy resin, in particular with thickness less then 10 µm, do not contain carbon particles, and therefore exhibit a transparency of approximately 20%, while the metal used for the heat-sink (copper) exhibits an absorption of about 50%. The laser radiation 26 has such an intensity, i.e., an energy per unit area, so as to cause the formation of plasma with each pulse. The plasma originates from the transformation of the metal atoms and metal oxide atoms located on the surface of the item to be treated (e.g., the heat-sink) using the high-intensity radiation. The formation of plasma is associated with vaporization of at least part of the residue 14 material present on the impact surface in a circular area of about 2 mm in diameter. Application of the laser radiation in the range of the green visible light after having applied the infrared radiation allows the metal forming the heat-sink and the terminals to be cleaned with a high degree of efficiency.

The radiation in the range of the green visible light also has a direct attack effect on the resin, however, such an effect is negligible compared to the direct attack effect of the infrared radiation. Thus, the green visible light radiation alone does not allow effective cleaning of the metal from the plastic residue.

Since the degree of removal of material depends on the energy absorbed at the point of impact, the duration of application of the radiations, both the infrared and the green visible light radiations (i.e., the number of pulses applied per unit area) is calculated as a function of the thickness of the residues to be eliminated. With a single pass of beam 27, followed by a pass of beam 26, it is possible to remove both thin residual films (1 to 10 $\mu$m) and thicker residual films (1 to 50 $\mu$m).

According to a preferred embodiment, the scanning of the surface of the heat-sink 12 is carried out along two concentric curves. The first scanning is along an outer curve substantially at the boundary of the plastic (resin) body 10. only the laser radiation in the range of the green visible light is used. This radiation does not damage the resin of the body 10 since it is not significantly absorbed by the plastic body. The second scanning is along an inner curve displaced from the boundary of the body 10. The infrared laser radiation is used if necessary. This is followed by a scan along the same inner curve with the radiation in the range of the green visible light. It is thus avoided that the infrared radiation strikes the body 10, which could damage the body.

Clearly, the method of the invention lends itself equally well to the removal of the residues of plastic from the terminals. It should be noted, moreover, that this method, both when used to treat the heat-sink and when used to treat the terminals, does not cause any significant mechanical stress on the terminals. In other words, they do not suffer any deformation in this phase of manufacture.

Whereas a single realization of the invention has been illustrated and described, it is clear that several variations and modifications are possible within the scope of the same inventive concept. For example, it would be possible to use laser devices of a different type to that described above. Similarly, it is not strictly necessary that the two laser radiations be an infrared radiation and a radiation in the range of the green visible light. In general, they will be a first radiation of wavelength suitable to be absorbed substantially by and directly attack the molding residues having a major thickness, and a second radiation of a wavelength such that the molding residues having a minor thickness are transparent to it, but such that the radiation is absorbed by the underlying metal to generate the plasma.

Additionally, even if it is preferred to use the same laser for generating the two radiations using frequency division or multiplication devices, it is apparent that alternatively it is possible to use two different lasers with different output wavelengths. For example, for the generation of the second radiation it would be possible to use a krypton fluoride excimer laser which irradiates with pulses 25 ns wide with a wavelength of 248 nm (ultraviolet), or other types of pulsed lasers preferably with a wavelength between 180 and 700 nm and with pulses between 3 and 30 ns wide.

With respect to the use of two distinct optical scanning devices for the two radiations, it is apparent that this is not a limitation. Should it be available that a single optical scanning device is capable of handling both the radiations, it would be clearly sufficient to implement the method according to the invention.

That which is claimed is:

1. A method for removing residues of molding material from metal parts of plastic packages of semiconductor devices, the method comprising:
   applying a first pulsed laser radiation to at least one surface region of a metal part covered with residues of molding material, the first pulsed laser radiation having a first wavelength absorbed by the residues of molding material having a thickness greater than a predetermined value, and an intensity and duration of the first pulsed laser radiation causing the residues of molding material having the thickness greater than the predetermined value to be directly attacked; and
   applying a second pulsed laser radiation to the at least one surface region of the metal part covered with residues of molding material, the second pulsed laser radiation having a second wavelength so that the residues of molding material having a thickness less than the predetermined value are at least partially transparent and the metal part is at least partially absorbent with respect of the second pulsed laser radiation, and an intensity and duration of the second pulsed laser radiation causing formation of plasma at a point of impact with the metal part.

2. A method according to claim 1, wherein a boundary region between the at least one surface region of the metal part and a body of the plastic package receives only the second pulsed laser radiation.

3. A method according to claim 1, wherein the second wavelength is in a range of about 180 to 700 nm.

4. A method according to claim 1, wherein the first pulsed laser radiation comprises infrared light, and the second pulsed laser radiation comprises green visible light.

5. A method according to claim 4, wherein the first wavelength is about 1000 nm, and the second wavelength is about 500 nm.

6. A method according to claim 1, wherein the first pulsed laser radiation is generated by an Nd:YAG laser, and the method further comprises halving the first wavelength to generate the second wavelength.

7. A method according to claim 1, wherein the first and second pulsed laser radiations are applied having pulse durations in a range of about 3 to 30 ns.

8. A method according to claim 1, wherein the steps of applying the first and second pulsed laser radiations comprises scanning the first and second pulsed laser radiations over the at least one surface region of the metal part covered with residues of molding material, and the duration of applying the first and second pulsed laser radiations is based upon a number of radiation pulses applied per unit area.

9. A method according to claim 8, wherein the scanning is synchronized with emission of the radiation pulses.

10. A method according to claim 1, wherein the molding material is an epoxy resin including carbon particles as an additive.

11. A method according to claim 10, wherein the carbon particles have dimensions greater than about 10 $\mu$m, and the predetermined value of the thickness of the molding material is about 10 $\mu$m.

12. A method according to claim 1, wherein the metal parts comprise copper parts.

13. A method according to claim 1, wherein the metal parts comprise nickel-plated copper parts.

14. A method for removing residues of molding material from metal parts of plastic packages of semiconductor devices, the method comprising:
   applying a first pulsed laser radiation to at least one surface region of a metal part covered with residues of molding material, the first pulsed laser radiation having a first wavelength absorbed by the residues of molding material having a thickness greater than a predetermined value; and applying a second pulsed laser radiation to the at least one surface region of the metal part covered with residues of molding material, the second pulsed laser radiation having a second wavelength so that the residues of molding material having a thickness less than the predetermined value are at least partially transparent and the metal part is at least partially absorbent with respect of the second pulsed laser radiation.

15. A method according to claim 14, wherein an intensity and duration of the first pulsed laser radiation causes the residues of molding material having the thickness greater than the predetermined value to be directly attacked.

16. A method according to claim 14, wherein an intensity and duration of the second pulsed laser radiation causes formation of plasma at a point of impact with the metal part.

17. A method according to claim 14, wherein a boundary region between the at least one surface region of the metal part and a body of the plastic package receives only the second pulsed laser radiation.

18. A method according to claim 14, wherein the second wavelength is in a range of about 180 to 700 nm.

19. A method according to claim 14, wherein the first pulsed laser radiation comprises infrared light, and the second pulsed laser radiation comprises green visible light.

20. A method according to claim 14, wherein the first wavelength is about 1000 nm, and the second wavelength is about 500 nm.

21. A method according to claim 14, wherein the first pulsed laser radiation is generated by an Nd:YAG laser, and the method further comprises halving the first wavelength to generate the second wavelength.

22. A method according to claim 14, wherein the first and second pulsed laser radiations are applied having pulse durations in a range of about 3 to 30 ns.

23. A method according to claim 14, wherein the steps of applying the first and second pulsed laser radiations comprises scanning the first and second pulsed laser radiations over the at least one surface region of the metal part covered with residues of molding material, and the duration of applying the first and second pulsed laser radiations is based upon a number of radiation pulses applied per unit area.

24. A method according to claim 23, wherein the scanning is synchronized with emission of the radiation pulses.

25. A method according to claim 14, wherein the molding material is an epoxy resin including carbon particles as an additive.

26. A method according to claim 25, wherein the carbon particles have dimensions greater than about 10 μm, and the predetermined value of the thickness of the molding material is about 10 μm.

27. A method according to claim 14, wherein the metal parts comprise copper parts.

28. A . A method according to claim 14, wherein the metal parts comprise nickel-plated copper parts.

29. A method for removing residues of molding material from metal parts of plastic packages of semiconductor devices, the method comprising:

applying first laser radiation having a first wavelength to at least one surface region of a metal part covered with residues of molding material; and applying second laser radiation having a second wavelength different than the first wavelength to the at least one surface region of the metal part covered with residues of molding material.

30. A method according to claim 29, wherein the first and second laser radiations are pulsed radiation.

31. A method according to claim 29, wherein the first laser radiation has a first wavelength absorbed by the residues of molding material having a thickness greater than a predetermined value, and an intensity and duration of the first laser radiation causes the residues of molding material having the thickness greater than the predetermined value to be directly attacked.

32. A method according to claim 29, wherein the second laser radiation has a second wavelength so that the residues of molding material having a thickness less than the predetermined value are at least partially transparent and the metal part is at least partially absorbent with respect of the second laser radiation, and an intensity and duration of the second laser radiation causes formation of plasma at a point of impact with the metal part.

33. A method according to claim 29, wherein a boundary region between the at least one surface region of the metal part and a body of the plastic package receives only the second laser radiation.

34. A method according to claim 29, wherein the second wavelength is in a range of about 180 to 700 nm.

35. A method according to claim 29, wherein the first laser radiation comprises infrared light, and the second laser radiation comprises green visible light.

36. A method according to claim 35, wherein the first wavelength is about 1000 nm, and the second wavelength is about 500 nm.

37. A method according to claim 29, wherein the first laser radiation is generated by an Nd:YAG laser, and the method further comprises halving the first wavelength to generate the second wavelength.

38. A method according to claim 30, wherein the first and second pulsed laser radiations are applied having pulse durations in a range of about 3 to 30 ns.

39. method according to claim 29, wherein the steps of applying the first and second laser radiations comprises scanning the first and second laser radiations over the at least one surface region of the metal part covered with residues of molding material, and the duration of applying the first and second laser radiations is based upon a number of radiation pulses applied per unit area.

40. A method according to claim 39, wherein the scanning is synchronized with emission of the radiation pulses.

41. A method according to claim 29, wherein the molding material is an epoxy resin including carbon particles as an additive.

42. A method according to claim 41, wherein the carbon particles have dimensions greater than about 10 μm, and the predetermined value of the thickness of the molding material is about 10 μm.

* * * * *

UNITED STATES PATENT AND TRADEMARK OFFICE
CERTIFICATE OF CORRECTION

PATENT NO.    : 6,468,356 B1
DATED         : October 22, 2002
INVENTOR(S)   : Paolo Crema, Roberto Tiziani and Markus Guggenmos It is certified that error appears in the above-identified patent and that said Letters Patent is hereby corrected as shown below:

<u>Title page,</u>
Item [63], Related U.S. Application Data, delete "Continuation of application No. 09/156,782, filed on Sep. 17, 1998, now abandoned." insert -- Continuation-in-part of application No. 09/156,782, filed on Sep. 17, 1998, now abandoned. --

Signed and Sealed this

Twenty-third Day of September, 2003

JAMES E. ROGAN
*Director of the United States Patent and Trademark Office*